US011048180B2

(12) United States Patent
Nikipelov et al.

(10) Patent No.: US 11,048,180 B2
(45) Date of Patent: Jun. 29, 2021

(54) COMPONENT FOR USE IN A PATTERNING DEVICE ENVIRONMENT

(71) Applicant: ASML Netherlands B.V., Veldhoven (NL)

(72) Inventors: Andrey Nikipelov, Eindhoven (NL); Vadim Yevgenyevich Banine, Deurne (NL); Christian Gerardus Norbertus Hendricus Marie Cloin, Eindhoven (NL); Edwin Te Sligte, Waalre (NL); Marcus Adrianus Van De Kerkhof, Helmond (NL); Ferdinandus Martinus Jozef Henricus Van De Wetering, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/571,956

(22) Filed: Sep. 16, 2019

(65) Prior Publication Data

US 2020/0096880 A1 Mar. 26, 2020

(30) Foreign Application Priority Data

Sep. 25, 2018 (EP) .................................... 18196629
Jan. 3, 2019 (EP) .................................... 19150186

(51) Int. Cl.
*G03F 7/20* (2006.01)

(52) U.S. Cl.
CPC ........ *G03F 7/70916* (2013.01); *G03F 7/7095* (2013.01)

(58) Field of Classification Search
CPC ............. G03F 7/70916; G03F 7/70958; G03F 7/7095; G03F 7/70033; G03F 7/7015; G03F 7/70316; G03F 7/708; G03F 7/70841; G03F 7/70858; G03F 7/70908; G03F 7/70925; G03F 7/70991; G03F 1/66; G03F 1/68; G03F 1/82; G03F 1/84
USPC ........ 355/18, 30, 52–55, 60, 66–77; 378/34, 378/35; 250/492.1, 492.2, 492.3, 493.1, 250/503.1, 504 R, 515.1, 517.1, 518.1
See application file for complete search history.

(56) References Cited

U.S. PATENT DOCUMENTS

| | | | | |
|---|---|---|---|---|
| 6,031,598 A | * | 2/2000 | Tichenor | B82Y 10/00 355/67 |
| 2008/0011967 A1 | * | 1/2008 | Van Herpen | G03F 7/70925 250/492.2 |
| 2009/0014027 A1 | * | 1/2009 | Schriever | G03F 7/70483 134/1.1 |

(Continued)

FOREIGN PATENT DOCUMENTS

DE  102015203160 A1 * 9/2015 ......... G03F 7/70841

OTHER PUBLICATIONS

English translation of DE102015203160, published Sep. 17, 2015. (Year: 2015).*

*Primary Examiner* — Christina A Riddle
(74) *Attorney, Agent, or Firm* — Sterne, Kessler, Goldstein & Fox P.L.L.C.

(57) ABSTRACT

A component for use in a patterning device environment including a patterning device, wherein the component is treated to suppress EUV plasma-induced contaminant release and/or atomic hydrogen or other radicals induced defectivity. A conduit array comprising at least one conduit, wherein the at least one conduit has been treated to promote adhesion of a contaminant to the at least one conduit.

13 Claims, 8 Drawing Sheets

(56) References Cited

U.S. PATENT DOCUMENTS

2013/0247935 A1\* 9/2013 Park .................... G03F 7/70708
                                                        134/1
2019/0196321 A1\* 6/2019 Kim ......................... G03F 1/58
2019/0302624 A1\* 10/2019 Moser ................. G03F 7/70316
2020/0166847 A1\* 5/2020 Liebaug ................ G03F 7/7015

\* cited by examiner

COMPONENT FOR USE IN A PATTERNING DEVICE ENVIRONMENT

FIELD

The present invention relates to a component for use in a patterning device environment.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

EUV radiation may contribute to the generation of contamination within the lithographic apparatus. For example, the EUV radiation may interact with matter present in the lithographic apparatus (e.g. small amounts of gas) to form a plasma. The plasma may provide suitably strong electrostatic force to release contaminant particles from surfaces within the lithographic apparatus. The reticle environment primarily comprises low pressure $H_2$, that is needed to maintain optical components clean, thus EUV radiation absorbed in the gas primarily generates $H^+$, $H_3^+$ and $H^*$. Active gas species, such as $H^*$, generated from gas interacting with EUV radiation may promote particle release or generation within lithographic apparatus. In general, increasing the power of the EUV radiation increases the number of particles that are released from surfaces by EUV generated plasma.

The contaminant particles may be transported to and be incident upon, sensitive optical surfaces. For example, contaminant particles may be incident upon the patterning device (i.e. on the mask or reticle). Such contaminant particles may be imaged onto the substrate and disrupt the desired projected pattern, resulting in a defective product being manufactured by the lithographic apparatus. As another example, contaminant particles may damage components of the lithographic apparatus or objects present in the lithographic apparatus (e.g. they may rupture a pellicle that protects the reticle), thereby increasing the frequency of maintenance activity and reducing the throughput of the lithographic apparatus. It may therefore be desirable to mitigate one or more of the above problems.

SUMMARY

According to a first aspect of the present invention, there is provided a component for use in a patterning device environment including a patterning device, wherein the component is treated to suppress EUV plasma-induced contaminant release and/or atomic hydrogen or other radicals induced defectivity.

The component may comprise a coating, the coating comprising a conductive coating and/or a high recombination coefficient coating.

The conductive coating and the high recombination coating may be provided as the same material. That is, the coating may be both conductive and have a high recombination coefficient.

Advantages include reducing the release of particles by ions/electrons/photons. Release of particles by charged species (ions/electrons) and by photons from dielectric components in the RME (reticle-mini environment) may take place via stochastic charging and so, may be suppressed by introducing conductive coatings, that remove fluctuations of local (near particle) charge and/or charge density due to very high mobility of electrons within the coating.

Furthermore, advantages include reducing the release and/or generation of particles due to presence of atomic hydrogen by suppressing atomic hydrogen ($H^*$) flux and concentration to the most contaminated areas in the patterning device environment. This may be by coating at least within high aspect ratio slits, that feature high recombination efficiency for atomic hydrogen (preferably, recombination coefficient $\gamma > 0.1$).

The conductive coating may comprise at least one of a metal, metal alloy, noble metal, noble metal alloy, Ru, Rh, Pd, Pt, a conductive ceramic based on metal nitride, boride, oxide, carbide or a mix of ceramics, for example CrN, TiN, ZrN, ZrB, TaB, TiO, $CrO_2$, $MnO_2$, $MoO_2$, $TcO_2$, $RuO_2$, $RhO_2$, $WO_2$, $ReO_2$, $IrO_2$, $Mo_4O_{11}$, $ReO_3$.

The conductive component may have a noble metal concentration of at least 5%. The conductive component may have a noble metal concentration of at least 10%. The conductive component may have a noble metal concentration of at least 50%.

The coating may have a high-recombination coefficient for atomic hydrogen.

The coating may have a recombination coefficient for atomic hydrogen of at least 0.1 and/or may comprise a noble metal or a noble metal alloy. This may provide additional efficiency in suppressing $H^*$ flux to the critical (most contaminated) regions near the reticle.

The coating may have an increased recombination coefficient for atomic hydrogen when compared with a component without the coating.

The component may be one of a patterning device support, a clamp, a fiducial, an encoder, a patterning device masking apparatus, a patterning device masking apparatus motion/control module, a radiation beam uniformity adjustment apparatus, a patterning device exchange apparatus, a patterning device actuator, a gas exhaust system, a contaminant seal configured to isolate a volume for the patterning device from a relative vacuum or low-pressure environment, and a housing of the relative vacuum or low-pressure environment.

The component may comprise a dielectric.

The component may comprise an inter-diffusion layer between the conductive coating and the dielectric.

The inter diffusion layer may be between the dielectric surface and the noble metal coating. The inter-diffusion layer may comprise transitional metal, such as Cr, Ti, Ni. The inter diffusion layer may improve robustness of metallic, and especially noble metal coating, on dielectric (glass or ceramic) components.

The conductive coating on the patterning device masking apparatus may be located on at least a side facing the patterning device.

The conductive coating on the radiation beam uniformity adjustment apparatus may be located on at least a side facing away from the radiation beam. The conductive coating on the actuator may be located on at least a side facing the patterning device.

The conductive coating on the gas exhaust system may be located on at least the surfaces where flushing re-deposits some contaminants. This may be the surfaces facing the patterning device.

The conductive coating on the housing of the relative vacuum or low-pressure environment may be located at least a side facing the contaminant seal.

The patterning device actuator may be a long stroke actuator. The patterning device actuator may be a short stroke actuator.

The conductive coating may be provided on a significant portion of the dielectric components in the RME. Additional metallization may be located on the fiducial and/or encoder facing to and/or away from the patterning device, and/or metallization of the chuck (patterning device support). The conductive coating may be provided on more than 50%, and may be preferably on more than 90% of the dielectric surfaces, of the dielectric components.

The component may be metallic and/or may have an additional conductive coating upon which the coating is located.

A surface of the component may have been treated to provide projections to increase the effective surface area.

The surface of the component may have been treated to increase the roughness to increase the effective surface area.

The conductive coating may comprise the projections to increase the effective surface area.

The projections may be provided on one of the gas exhaust system, the patterning device exchange apparatus, the patterning device actuator, the contaminant seal, and the housing of the relative vacuum or low-pressure environment.

The pitch ($\lambda$) of the projections to the amplitude (A) of the projections may be $\lambda/A<0.3$. The pitch ($\lambda$) of the projections to the amplitude (A) of the projections may be $\lambda/A<0.1$.

According to a second aspect of the present invention, there is provided a component for use in a patterning device environment including a patterning device, wherein the component is made from at least one of a metal, metal alloy, noble metal, noble metal alloy, Ru, Rh, Pd, Pt, a conductive ceramic based on metal nitride, boride, carbide, oxide or a mix of ceramics, for example CrN, TiN, ZrN, ZrB, TaB, TiO, $CrO_2$, $MnO_2$, $MoO_2$, $TcO_2$, $RuO_2$, $RhO_2$, $WO_2$, $ReO_2$, $IrO_2$, $Mo_4O_{11}$, $ReO_3$.

The component may be one of a patterning device masking apparatus, a patterning device masking apparatus motion/control module, a radiation beam uniformity adjustment apparatus, a patterning device exchange apparatus, a patterning device actuator, a gas exhaust system, a contaminant seal configured to isolate a volume for the patterning device from a relative vacuum or low-pressure environment, and a housing of the relative vacuum or low-pressure environment.

According to a third aspect of the present invention, there is provided a lithographic apparatus comprising a component as described above.

The lithographic apparatus may further comprise an electrical connector for adding a voltage bias to the conductive coating provided on at least one dielectric component.

The bias may be provided by a voltage source. The bias may be limited to no more than 10 V and the current may be limited to no more than 100 mA. The current may be limited to no more than 10 mA. This may prevent sparks and other high energy forms of discharges that may generate contaminants.

The bias may be provided between the conductive coating on one or more dielectric components and existing metallic components (and naturally grounded parts). The bias is intended to extract ions and electrons by an electric field. This may further reduce the reach of ions and electrons in the RME.

According to a fourth aspect of the present invention, there is provided a lithographic apparatus comprising a gas inlet, wherein the gas inlet is configured to supply a gas for converting atomic hydrogen to molecules or less reactive radical.

The gas supplied may comprise $H_2$ and <0.1% of one or more of gases $O_2$, $H_2O_2$, NO and $NO_2$.

The gas supplied in the RME ($H_2$) may be provided with a low concentration (<0.1%) of gases, for example $O_2$, $H_2O_2$, NO, $NO_2$. This may efficiently remove H* via chemical reaction. This may be alternatively or additionally to component(s) having conductive or high recombination coatings or projections in the RME or patterning device environment. The same or different gas inlets may be used as the inlets for current $H_2$ supplies. This may be because diffusion effectively mixes the gases supplied via different inlets.

The gas inlet may be configured such that the gas flows at or near a contaminant seal configured to isolate a volume for the patterning device from a relative vacuum or low-pressure environment and/or at or near a component of the patterning device environment such that radicals react with the gas rather than with contaminants.

According to a fifth aspect of the present invention, there is provided a method of suppressing radical induced defectivity in a patterning device environment, the method comprising: flowing gas from a gas inlet into a patterning device environment, the gas being for converting radicals to molecules.

BRIEF DESCRIPTION OF THE DRAWINGS

Embodiments of the invention will now be described, by way of example only, with reference to the accompanying schematic drawings, in which.

DETAILED DESCRIPTION

Figure 1:
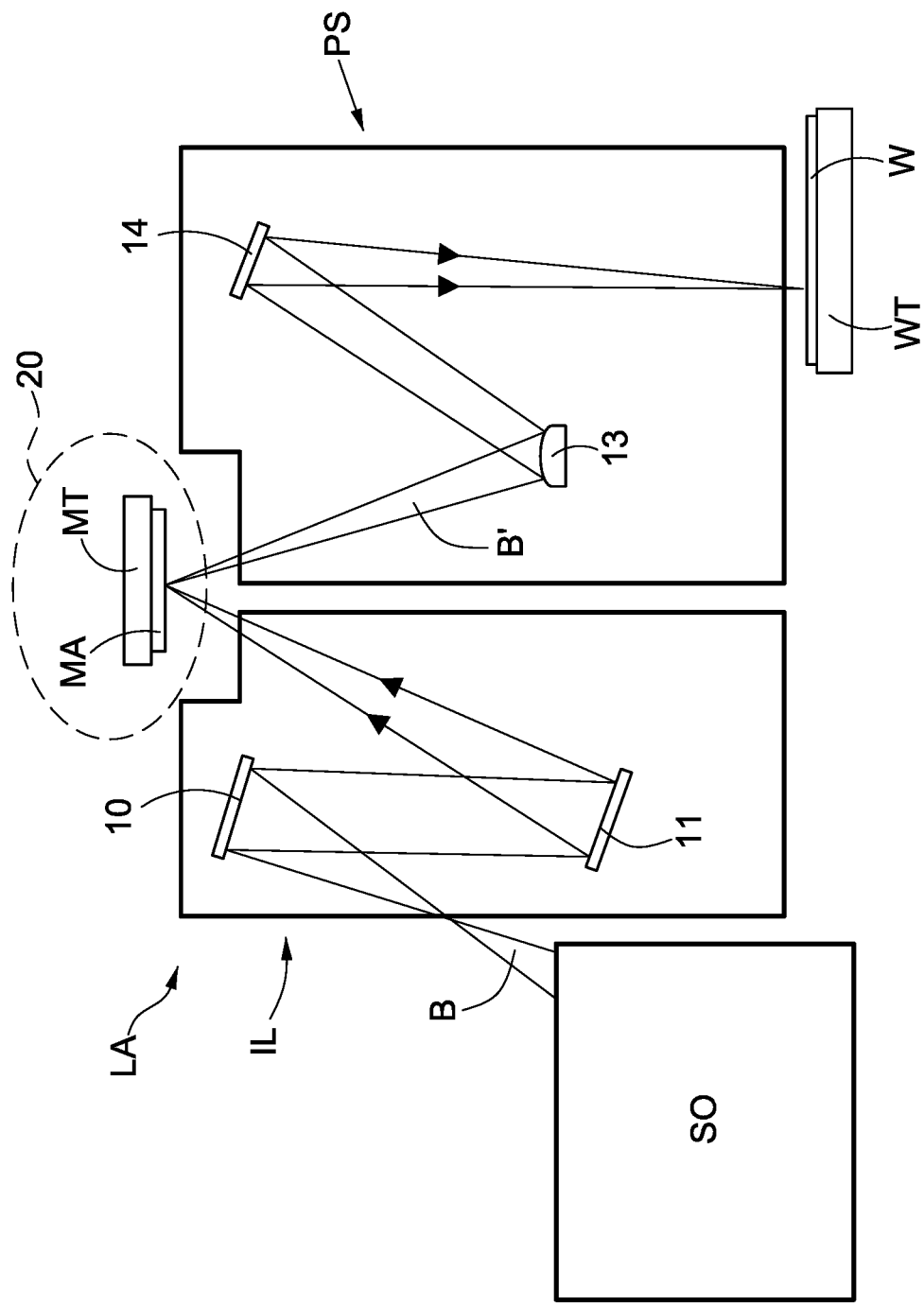
FIG. 1 depicts a schematic diagram of a lithographic system comprising a lithographic apparatus and a radiation source in accordance with an embodiment of the invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2:
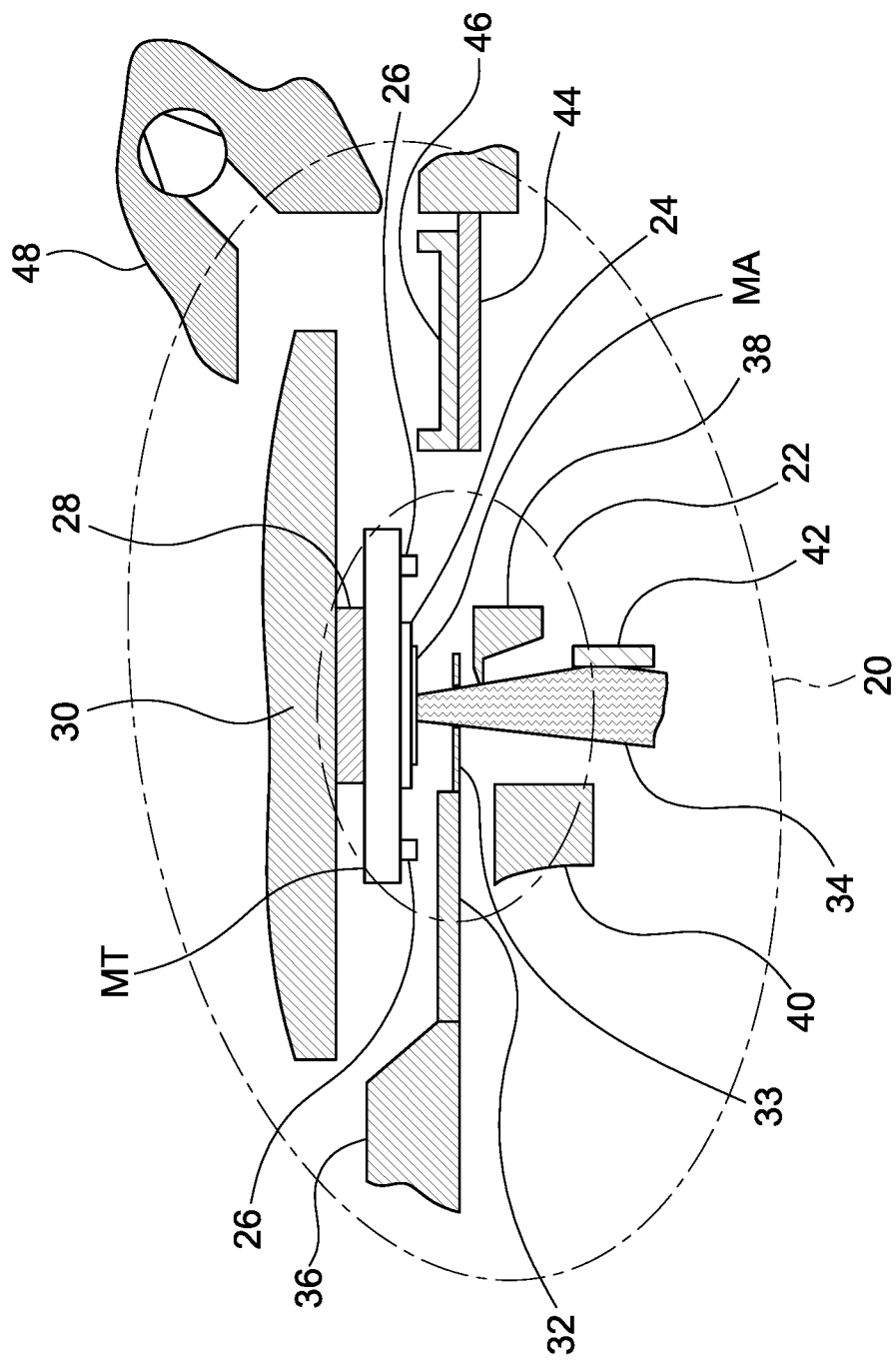
FIG. 2 depicts a schematic diagram of a patterning device environment comprising a patterning device and components in accordance with an embodiment of the invention.

FIG. 2 shows a portion of a lithographic apparatus, such as that shown in FIG. 1, which may be considered to be a patterning device environment 20. The patterning device environment 20 may include the patterning device MA and a plurality of components as will be described. Within the patterning device environment 20, there may be a reticle mini environment (RME) 22 as shown as a dashed line in FIG. 2. The RME 22 may be defined as a region within approximately 20-50 cm of the reticle. Several of the components are located within the RME 22.

Within the RME 22 of the patterning device environment 20 there is located a patterning device support (a support structure or a chuck) MT which is used to support the patterning device (mask) MA. A clamp 24 is used to hold the patterning device MA on the patterning device support MT.

Fiducial markers or fiducials 26 are located on the patterning device support MT. The fiducials 26 are used as reference points, i.e. fixed points to which other objects can be related or against which objects can be measured. Encoders are located with the fiducials 26.

The patterning device MA, the patterning device support MT, the clamp 24, the fiducials 26 and/or the encoders may be a dielectric or at least have portions that are dielectric, e.g. one or more dielectric surfaces, or be mostly dielectric with some metallization. These components may be made from e.g. low expansion ceramics/glasses or another suitable dielectric material. These components are shown as empty boxes, i.e. not hatched parts in FIG. 2.

The patterning device MA may be moved by actuators, i.e. patterning device actuators. Located within the RME 22, is a short stroke patterning device actuator 28. The short stroke actuator 28 may be located in a vacuum (i.e. a relative vacuum or low-pressure environment). Located within the patterning device environment 20 there is another patterning device actuator, i.e. a long stroke actuator 30. The long stroke actuator may be provided in an environment separated from RME 22 or connected with RME 22. In the case of connected environments, measures may be implemented to prevent particles generated and displaced by operating the actuator (for example from a cable/pipe slab) from contributing to defectivity of the patterning device MA.

A patterning device masking apparatus 32 is provided in the RME 22 in order to mask (or block) a radiation beam 34 (e.g. EUV beam) from being incident on the patterning device MA. The patterning device masking apparatus 32 may comprise a masking blade 33 which may move across the radiation beam 34 to mask the patterning device MA (i.e. stop the radiation beam 34). A patterning device masking apparatus motion/control module 36 is located in the patterning device environment 20 in order to control the movement of the patterning device masking apparatus 34.

Also located in the RME 22, is a radiation beam uniformity adjustment apparatus 38 which may be used to make sure the radiation beam 34 has the desired uniformity. Other components located at least partially in the RME 22, or wholly in the patterning device environment 20 include an illuminator top sleeve flow supply 40 and a G-mirror (grazing incidence mirror) 42. The illuminator top sleeve is an environment near G-mirror 42 and may also include pupil faceted mirror 11.

A patterning device exchange apparatus 44 is included in the patterning device environment 20. The patterning device exchange apparatus 44 may be used for transferring the patterning device MA to and from the patterning device support MT as required. A pod 46 located on the patterning device exchange apparatus 44 may be used to support and shield the patterning device MA during transport.

Also located at least partially in the patterning device environment 20 is a gas exhaust system 48 which is used to flush the patterning device environment 20 with gas during flushing and to provide a refresh of $H_2$ during EUV exposures. The gas inlet is omitted from FIG. 2 for simplicity but, typically, it may be integrated in or near one of the masking blades 33 of the masking apparatus 32. The gas exhaust system 48 may have a turbo connected for flushing hydrogen ($H_2$) and extra (extreme) clean dry air evacuation. The gas exhaust system 48 has a two-fold purpose to flush and to evacuate $H_2$.

The gas exhaust system 48 is for evacuating $H_2$ at low pressure during EUV operation and extra clean dry air (or dry nitrogen) during high pressure flushing. In both cases the gas is evacuated partially via exhaust, which is in vicinity of the RME 22. The particles that are air-borne have a relatively high chance to be redeposited near the exhaust (the flow bends and develops turbulence)—so it is generally a more contaminated area than other regions in the RME 22.

The short stroke actuator 28, the long stroke actuator 30, the patterning device masking apparatus 32, the patterning device masking apparatus motion/control module 36, the radiation beam uniformity adjustment apparatus 38, the ITS flow supply 40, the G-mirror 42, the patterning device exchange apparatus 44, the pod 46, and/or the gas exhaust system 48 may be metallic or at least have a conductive coating. These components are shown as hatched parts in FIG. 2.

The hatch density signifies surface cleanliness, i.e. the more dense the hatches, the more contaminated the parts are, e.g. by contamination particles. For example, they could be contaminated by integration or by use, e.g. bumpers of the patterning device masking apparatus motion/control module 36, or dirt displaced towards the turbo of the gas exhaust system 48 or brought by a pod 46 of the patterning device exchange apparatus 44. The bumpers are mechanical end stops for blade actuators and are used because there may be an impact when the range of motion is out of nominal.

Each of the components described above may be used in a patterning device environment 20 which includes the patterning device MA.

The EUV radiation beam 34 and plasma (i.e. ions and electrons) formed due to the EUV radiation beam 34 interacting with gas promote release, generation (and possibly transport) of contaminants to the patterning device MA. For example, particles per reticle pass measurements without the EUV radiation beam 34 being present may be 10 to 100 times fewer than when the EUV radiation beam 34 is on. The commonality for EUV induced defectivity is the supply of energy for the release or fragmentation of contaminants; it may be electrical or chemical energy, delivered in turn by ions/electrons (and photons) and by radicals.

The flux of ions, electrons and photons to contaminated dielectric surfaces or to piled-up dielectric particles (e.g. generated in scratching) may result in stochastic fluctuations of charge on particle(s) and on the surface of the dielectric components. This may, in turn, provide a release force exceeding the surface binding forces that are holding particles to the dielectric surfaces. This means that the particles may be released from the surface of the components and can then travel in the patterning device environment 20 and may end up on the patterning device MA. The piled up dielectric particles may be generated by scratching, which may occur during (mis)handling of parts at integration or in use. A sharp tip/edge may scratch a part, which may leave a pile of particles along and especially at the end of the scratch.

The charging of the particles and/or the dielectric surfaces of the components may be delivered in several ways.

For example, it may be delivered via plasma (ions and electrons), due to ambipolar diffusion or by migration in an external electric field.

The charging may be delivered via 'fast electrons' (E~50-150 eV), produced within the EUV radiation beam 34, and propagating outwards. The reach (i.e. travel distance) of the fast electrons exceeds that of plasma. This is due to the fact that for high energy electrons, the cross-section of inelastic interaction with $H_2$ is lower than for 'typical plasma', moderate energy electrons E~1-10 eV. Furthermore, fast electrons have a far greater mean free path than ions. This limits the reach of typical plasma electrons via ambipolar diffusion (e.g. ion mean free path is a few mm in the RME 22, at a $H_2$ gas pressure of 5 Pa).

The charging may also be delivered via the EUV radiation beam 34 (e.g. scattered off the imaging reticle and/or the blade 33 of the patterning device masking apparatus 32) producing photo-current and charging floating surfaces up to ~100 V with respect to the nearest ground.

As mentioned, active gas species, such as H*, may be generated from gas interacting with the EUV radiation beam 34. The flux of H* to the particles may boost release (via adhesion reduction) or cause explosive fragmentation. This could occur in several ways.

For example, this may be by H* (with high diffusion coefficient in the particular material) converting to $H_2$ (with low diffusion coefficient in the same material). The $H_2$ getting trapped and forming high pressure bubbles which leads to a compressive stress. This stress released in an explosive manner produces gas-born (and fast, e.g. tens of m/s) contaminant particles.

As another example, H* also can react with the material of the particles (for example, forming metal hydrides, or etching (removing) halogens\non-metals from salts or ceramics leading to stress-induced fragmentation. Generally, selective reactivity of H* to some of the elements of a particle (for example etching or uptake) will lead to a build-up of stress that can be both tensile and compressive, and that can eventually lead to explosive fragmentation.

Another example is that the particle interface (surface) may change under H*. That is, the effective density may reduce and/or the particle can develop nano-roughness. Both these factors will lead to reduction of adhesion (i.e. reduction of van der Waals interaction).

Another example, is that particle surface (partial) crystallization induced via reactions with H* may cause significant reduction in particle binding forces (e.g. contact spot reduction, 'needles' growing at the contact interface particle/surface etc.)

Therefore, the gas-born particles may be generated via explosive fragmentation or via external stresses (charging, flow, vibrations etc.) once the adhesion has been sufficiently reduced.

There is also a risk of contamination through the interaction of H* with plastics or polymers. For example, a particle seal may be used to suppress transport of (plastic/polymer) slab-wear generated particles to the RME 22. However, X-motion of the long stroke actuator 30 (with coupled seal) in combination with possible H* induced release/fragmentation of particles (Z-motion, between seal and main frame or housing) may provide a diffusion-like transport of contaminants to the RME 22. X-motion is motion in the direction perpendicular to the scanning direction of the EUV radiation beam with respect to the reticle (conventionally the y-direction in Cartesian coordinates) and perpendicular to the direction of the optical path (i.e. the z-direction). Z-motion is motion in the direction of the optical path, e.g. the direction of the EUV radiation beam towards the reticle.

It has been realised that the contaminant particles may be generated, or deposited during integration or in use and/or can move around the patterning device environment 20 and may concentrate on the surfaces of some components rather than others, see e.g. the density of hatching in FIG. 2. Furthermore, the release or generation of contaminant particles from these components increases the defectivity on the substrates W. It is desired to improve the defectivity.

Figure 3:
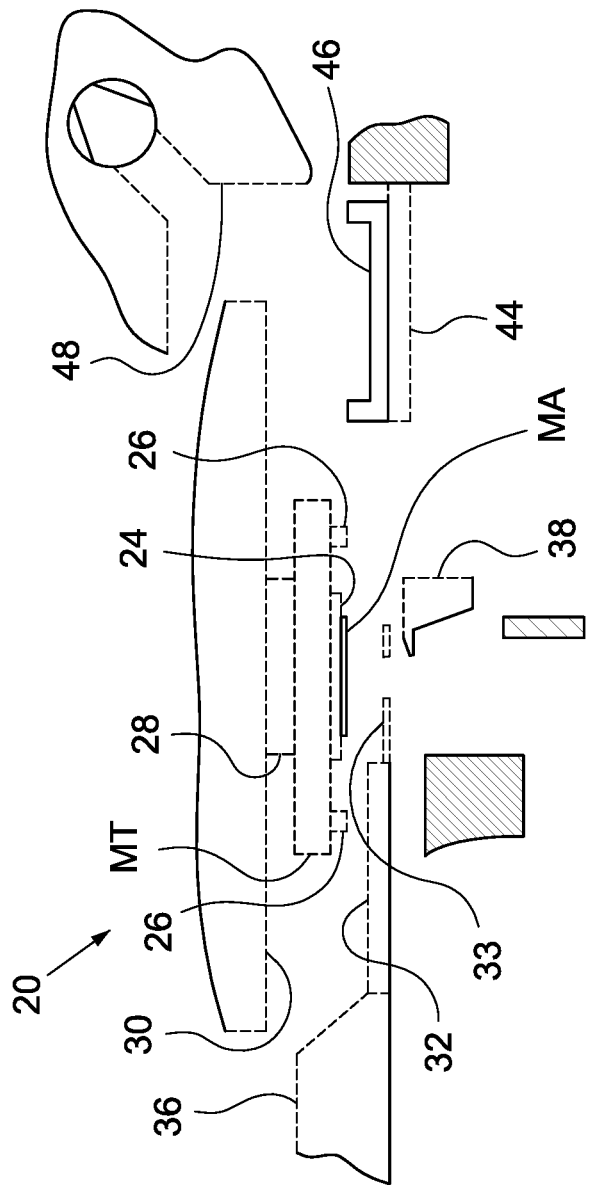
FIG. 3 depicts a schematic diagram of a patterning device environment comprising a patterning device and components in accordance with an embodiment of the invention.

FIG. 3 shows the patterning device environment 20 including the components and the patterning device MA. A conductive coating has been added to at least some of the dielectric surfaces of components in the patterning device environment 20. In other words, these surfaces have been treated by adding the conductive coating onto the dielectric surfaces.

More particularly, in this embodiment, the conductive coating has been added to the patterning device support MT, the clamp 24, the fiducials 26 and the encoders. In the embodiment shown in FIG. 3, the conductive coating has been added to the component surfaces shown as dashed lines. That is, the conductive coating on the fiducials and the encoders are on the sides facing to and away from the patterning device MA. In other embodiments, it will be appreciated that the conductive coating may be added to only one or more of these components or may be added to different surfaces of the components.

The release of particles from dielectric surfaces may happen due to stochastic charging of particles and (locally) surfaces by shot noise of a flux of ions and/or electrons and/or EUV-photons. The conductive coating removes the stochastic charge and replaces it by the uniform surface charge, which is provided by high mobility of electrons within the conductive coating. Thus, having the conductive coating aims to suppress particle release by stochastic charging.

In some embodiments, there is a provided an electrical conductor (not shown) for adding a small bias (e.g. U<10 V) with a current limited source (e.g. I<10 mA) to one or more of the conductive coating(s). This is to extract ions and electrons by an electric field, before they reach relatively contaminated, dielectric surfaces in the RME 22. The ions and electrons propagate from the source (EUV illuminated volume filled with gas) outwards mostly by ambipolar diffusion.

The moderate (<10 V) bias may be provided between one or more of the dielectric components having the conductive coating(s) and (generally grounded) metallic components in the RME 22. This is to further reduce the reach of ions and electrons in the RME 22. The voltage source should provide a bias limited to 10V and preferably is current limited to below 10 mA to prevent sparks and other high energy forms of discharges that may generate contaminants.

The conductive coating added to the dielectric surfaces may also be a high-recombination coefficient coating. That is, a coating with relatively high (increased) recombination properties for H*, for example having a recombination coefficient of at least 0.1. The recombination coefficient is between 0 and 1 and low values may be considered to be <0.01, and high values may be considered to be >0.1.

A coating with increased recombination properties for H* may suppress the flux of H* to the critically contaminated areas and may reduce H*-induced release/fragmentation of particles. This is because hydrogen radicals coming into contact with the coating will more readily recombine into molecules of hydrogen gas, i.e. $H_2$, which are less likely to cause defectivity.

There may be several suitable materials that provide the conductive coating and the desired recombination coefficient. A particularly suitable material for the coating would be a noble metal (e.g. Ru, Rh, Pd, Pt). This is because noble metals are quickly reduced (stripped of oxides) in EUV $H_2$ plasma. Furthermore, noble metals feature a high recombination coefficient once absent native oxide, which is attributed to some extent to the high physisorption of H*, and to another extent, to these metals catalytic properties.

The conductive coating may have at least 5% noble metal. The conductive coating may have at least 10% noble metal. More preferably, the conductive coating may have 50% or more noble metal.

An estimate of the recombination coefficient for a noble metal (with native oxide removed) is $\gamma\_noble\sim 0.1-0.2$.

A literature derived value for stainless steel (including effect of native oxide is) $\gamma\_steel\sim 0.005-0.01$.

For glasses and ceramics, which may be the materials for the patterning device support MT, the clamp 24, and other parts having a low coefficient of thermal expansion (CTE), the recombination coefficient is even lower, and may be $\gamma\_glass<0.001$.

Thus, it is clear that a noble metal has a relatively high recombination coefficient at least when compared with stainless steel and glass.

Due to gas leaking from a robot handler or gas bearings, other gases (other than $H_2$) are present in RME 22 in low concentrations, for example $N_2$. Noble metals are also particularly suitable since they may be resistant to nitridation or reactions with other gases (in the presence of H*, H+, $H_3^+$ and scattered EUV) as much as to oxidation and thus may stay metallic and preserve high recombination properties. This is with the exception of noble gases, which will not react with any material even when mixed with $H_2$ plasma. However, replacing Nitrogen with a noble gas may increase costs.

In the case of a noble metal coating (such as Ru)—the high recombination and conductivity may be provided by a single coating on the dielectric. An inter-diffusion layer (e.g. comprising transitional metal, such as Cr, Ti or Ni) may be provided between the dielectric (i.e. glasses/ceramics) and the conductive coating (e.g. the noble metal) for stability. It improves wetting of the coating of noble metal, since it is deposited on metal, while the inter-diffusion layer material chemically interacts with a native oxide and thus provides a good adhesion. The inter-diffusion layer improves robustness of the metallic, and especially the noble metal coating on dielectric (glass or ceramic) components.

Sputter deposition may be used to provide noble metal (e.g. Ru) or noble metal (e.g. Ru)+inter diffusion (e.g. Cr) coatings.

Ions cause the release of particles from the dielectric surfaces of the patterning device support MT, the clamp 24, the fiducials/encoders 26 and the reticle side(s). This occurs where the dielectric surfaces are re-contaminated during flushing or by particles released from the metallic surfaces under a flux of H*. However, a conductive coating on at least some of the dielectric parts in the RME 22 helps prevent particle release from the dielectric parts (e.g. the patterning device support MT, the clamp 24, the fiducials/encoders 26) by reducing stochastic charging. Therefore, a conductive coating on the dielectric parts in the RME 22 as described above suppresses plasma-induced particle release and H*-induced defectivity.

The conductive coating may also attract the charged particles in some instances. This may be by a mirror-charge interaction. Thus, the use of the conductive coating may help reduce the number of charged particles moving in the patterning device environment 20.

The conductive coating applied to dielectric components may be at least one of a noble metal, a noble metal alloy, preferably comprising Ru, Rh, Pd, Pt; or a metal, a metal alloy, or a conductive ceramic, based on metal nitride, boride, carbide, oxide or a mix of ceramics: for example $CrN$, $TiN$, $ZrN$, $ZrB$, $TaB$, $TiO$, $CrO_2$, $MnO_2$, $MoO_2$, $TcO_2$, $RuO_2$, $RhO_2$, $WO_2$, $ReO_2$ $IrO_2$, $MO_4O_{11}$, $ReO_3$.

A high recombination coefficient coating applied to conductive components may be at least one of a noble metal, a noble metal alloy, preferably comprising Ru, Rh, Pd, Pt, where noble metal concentration may be at least 5%, and preferably at least 50%, or a coating with a recombination coefficient of at least 0.1. This coating may be any metal that is capable to being stripped of native oxides in the presence of EUV plasma in hydrogen.

The coating may be both conductive and have a high recombination coefficient. That is, both the conductive coating and the high recombination coefficient coating are made from the same material. It will be appreciated that where reference is made to a conductive coating, this may be considered to be a conductive coating which may have a high recombination coefficient.

In the embodiment shown in FIG. 3, a conductive coating with increased recombination properties for H* has also been added to components in the patterning device environment 20 which are metallic and/or already have a conductive coating (herein referred to as an additional conductive coating). In other words, these metallic/conductive coating surfaces have been treated by adding the conductive coating with increased recombination properties for H* onto the surfaces.

In this context, the conductive coating has increased recombination properties for H* (hydrogen radicals) when compared with a component without the conductive coating.

More particularly, in this embodiment, the conductive coating with increased recombination properties for H* has been added to the patterning device masking apparatus 32, the patterning device masking apparatus motion/control module 36, the radiation beam uniformity adjustment apparatus 38, the patterning device exchange apparatus 14, the patterning device long stroke actuator 30, and the gas exhaust system 48. Such a coating will reduce steady state concentration of H* near the critically contaminated surfaces.

In the embodiment shown in FIG. 3, the conductive coating has been added to the component surfaces shown as dashed lines. That is, the conductive coating on the patterning device masking apparatus 32 is located on the blade(s) 33 of the patterning device masking apparatus 32. In some embodiments, the conductive coating on the patterning device masking apparatus 32 is located at least a side facing the patterning device MA in use.

The conductive coating on the patterning device masking apparatus motion/control module 36 is located on at least a side facing the patterning device MA in use. The conductive coating on the radiation beam uniformity adjustment apparatus 38 is located on at least a side facing away from the EUV radiation beam 34 (shown in FIG. 2).

The conductive coating on the long stroke actuator 30 is located on each of its sides except the side facing away from the patterning device MA in use. In some embodiments, the conductive coating on the long stroke actuator 30 is located on at least a side facing the patterning device MA in use.

The conductive coating on the exhaust system 48 may be located on at least the surfaces where flushing re-deposits some contaminants, primarily near the turbo pump (which blades can bounce off particles during flushing or EUV exposure operation) or near bends, which will favour deposition of particles escaping from the flow by inertia. That is, the surfaces facing the patterning device MA.

In other embodiments, it will be appreciated that the conductive coating may be added to only one or more of these components or may be added to different surfaces of the components. The use of the conductive coating on only some surfaces of the components (e.g. the surfaces shown in dashed lines) may be because suppression is most effective in slits (molecules collide with walls many times before propagating deep into high aspect ratio slit/gap). Slits may be defined by e.g. the patterning device MA and the blades 33, and by the patterning device support MT and the patterning device exchange apparatus 44. In principle, coating most elements in the RME 22, and further with noble metal is beneficial, since it may reduce outgassing (molecular contamination). However, the greater the distance to the RME 22 (from the to-be-coated component) the less effective this measure is since the impact may is reduced.

The conductive coating may be made from several suitable materials that have increased recombination properties for H*. A particularly suitable material would be Ru or another noble metal.

Noble metals are quickly reduced (stripped of native oxide) in the conditions of the EUV lithographic apparatus (so, $H_2$ at a few pascal and plasma/EUV with other gases with concentrations <0.1%). Furthermore, oxide-free metals are effective in hydrogen recombination (mostly due to high physisorption energy for H* and mobility of physiosorbed radicals).

It has been realised that the hydrogen radicals reach the most contaminated surfaces (i.e. the surfaces of the patterning device masking apparatus motion/control module 36, and the gas exhaust system 48). The hydrogen radicals propagate in relatively narrow slits, e.g. the slits being defined by the patterning device MA and the blades 33, and by the patterning device support MT and the patterning device exchange apparatus 44 in some cases. In these relatively narrow slits, concentration profile may be approximated in a formula:

$$n(x) = n_0 e^{-\gamma x/2h}$$

Where γ—recombination coefficient (~0.01 for stainless steel, 0.001 for glass/ceramic, ~0.1 for noble metals (with native oxide removed or not even formed), x—coordinate along the slit h—height of the gap $n_0$—concentration in the volume (at the slit entrance).

Typically, the aspect ratio of the gap, which separates H* generated in EUV cone from significantly contaminated surfaces is $x_{cr}/h \cong 10$ to 50. Therefore, for the typical recombination of γ~0.005 to 0.01 the suppression of H* via recombination may be negligible and H* diffuses to the critically contaminated patterning device masking apparatus motion/control module 36 and causes H*-induced release. This "typical" recombination value has been averaged between glass patterning device support MT and the stainless steel patterning device masking apparatus 32, periodically re-oxidized during Extra (Extreme) Clean Dry Air flushing. Also, H* diffuses or is brought by the flow to the radiation beam uniformity adjustment apparatus 38 and the turbopump input of the gas exhaust system 48, where it may also cause H*-induced release.

Having the conductive coating with increased recombination properties for H* on the components means that more hydrogen radicals will be recombined into $H_2$ at the surfaces with the conductive coating. This will lead to fewer hydrogen radicals propagating in the patterning device environment 20 and causing contaminant particles release and/or generation. Thus, the use of the conductive coating with increased recombination properties for H* on the components of the patterning device environment 20 suppresses H*-induced defectivity.

Some components in the patterning device environment (such as the blade(s) 33 of the patterning device masking apparatus 32 or the cover plates etc) have previously been made from other materials, such as steel and aluminium. Steel and aluminium have electrically insulating oxides. It has been realised that native and EUV-driven oxidation of these materials can lead to enhanced particle (contaminant) release and defectivity, either due to formation of an oxide layer, that is thicker than native oxide layer or due to increase in roughness, associated with a repeated reduction and oxidation.

To reduce the particle release and defectivity, the conductive coating may be made from a conductive material that is significantly noble such that they do not oxidize in the lithographic apparatus, for example a noble metal or noble metal alloy.

Alternatively, to reduce the particle release and defectivity, the conductive coating may be made from a metal that has conductive oxides so that EUV-induced oxidation does not result in an increase in charging stochastic effects. Furthermore, the conducting coatings based on conducting ceramic (such as metal oxide, nitride, boride or carbide), offers greater robustness against mechanical wear and may be preferred on the spots, that are subject to handling or other mechanical loads.

In some embodiments, a conductive surface may attract particles charged in pulsing plasma or tribo-charged in collisions via mirror charge.

Advantages may include lower defectivity on the patterning device MA front side, and a potential CoG (cost of goods) reduction.

In another embodiment, at least one of the surfaces on at least one of the components of the long stroke actuator 30, the gas exhaust system 48 and the patterning device exchange apparatus 14 is treated to increase the roughness of the surface. The roughness may be increased by being treated to providing projections on the surface. This may be done in number of different ways. For example, the metallic components may be subject to anisotropic etching via chemical or electrochemical treatment to develop the grain structure. In other example, a laser ablation can provide micro- or mini grooves or other patterns on the complex-geometry parts.

The increased roughness increases the effective surface area. This may increase recombination of H*. A typical pitch ($\lambda$) of the roughness features (the projections) to the amplitude (A) of roughness features (the projections), may be $\lambda/A<0.3$, and, more preferably, it may be $\lambda/A<0.3$. This may provide an increase of the recombination properties, that may scale $\sim A/\lambda$. In some embodiments, a nominal material of the component may be treated to increase the roughness. In other embodiments, the increased roughness can be combined with a high recombination coefficient coating to further increase the recombination effect.

In embodiments, the surface of the long stroke actuator 30 located on at least a side facing the patterning device MA and/or the surfaces of the gas exhaust system 48 where flushing re-deposits some contaminants may be treated to increase the roughness. In other embodiments, it will be appreciated that the increased roughness may be added to different components, only one or more of these components, or may be added to different surfaces of the components.

Figure 4:
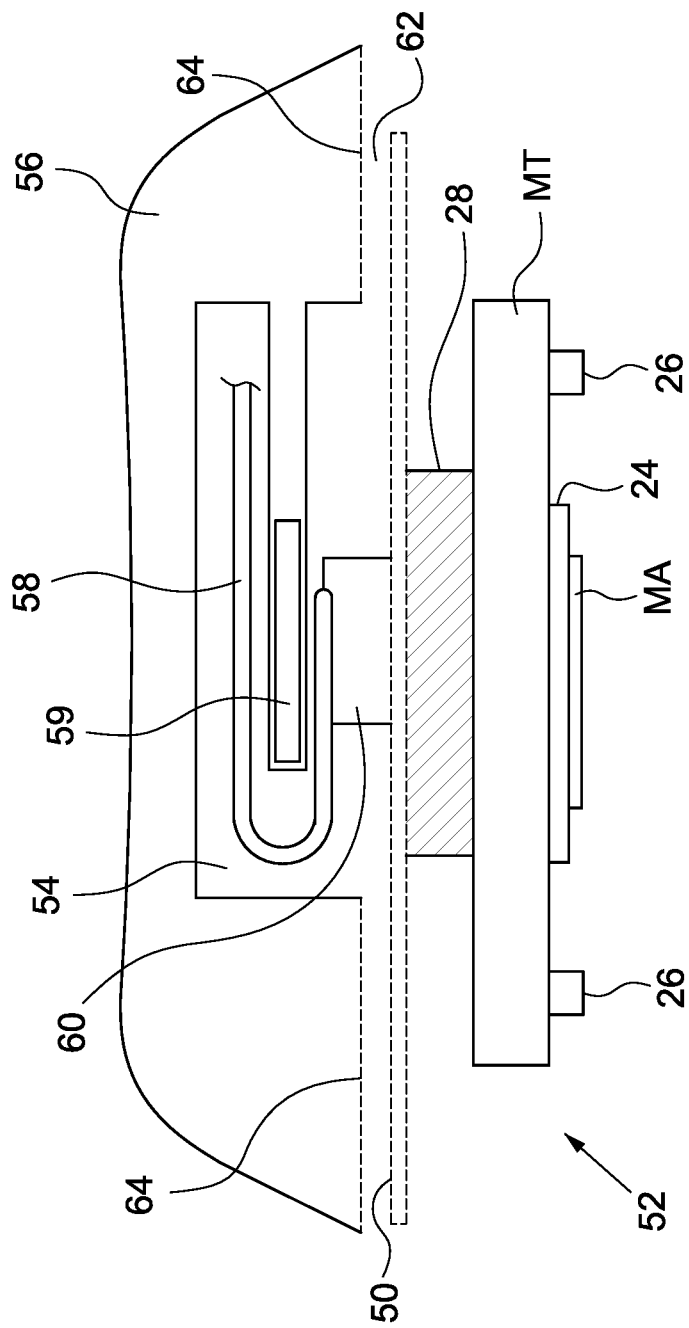
FIG. 4 depicts a schematic diagram of a contaminant seal separating an environment including a slab from a volume for the patterning device MA in accordance with an embodiment of the invention.

Referring to FIG. 4, a contaminant seal 50 is shown which is configured to isolate a volume 52 for the patterning device MA from a relative vacuum or low-pressure environment 54. The contaminant seal is made of the EUV-compatible materials, for example stainless steel, aluminium or titanium alloy. The relative vacuum or low-pressure environment 54 may be defined at least partially by a housing 56 which houses an in-vacuum slab 58 and a permanent magnet 59 of the in-vacuum long stroke motor 60 of the long stroke actuator 30. The housing 56 houses the relative vacuum or low-pressure environment 54. The particle seal 50 may be used to suppress transport of (plastic/polymer) slab-wear generated particles to the RME 22. This is achieved by a high aspect ratio slit 62 which is defined by the contaminant seal 50 and surfaces 64 (shown as dashed lines) of the housing 56 that are located opposite the contaminant seal 50, i.e. facing towards the contaminant seal 50. The slit 62 separates the critically contaminated relative vacuum or low-pressure environment 54 from the (volume 52 of the) RME 22 which includes the patterning device support MT, the clamp 24, the patterning device MA and the short stoke actuator 28.

In this embodiment, the contaminant seal 50 and the opposing surfaces 64 (shown as dashed lines) of the housing 56 are provided with a high recombination coefficient conductive coating, similar to as described above. In this embodiment, each of the surfaces of the contaminant seal 50 (shown as dashed lines) are treated to have the conductive coating but, in other embodiments, only the surface of the contaminant seal 50 facing the housing 56 may have the conductive coating applied. Similarly, in this embodiment, only the side of the housing 56 facing the contaminant seal 50 (i.e. surfaces 64—shown as dashed lines) is treated to have the conductive coating but, in other embodiments, other surfaces of the housing 56 may have the conductive coating applied.

In other embodiments, in addition, or alternatively to, the high recombination coefficient being applied to the contaminant seal 50 and the housing 56, one or more of the surfaces of one or more of the contaminant seal 50 and the housing 56 may be treated to increase the roughness of the surface. The surface may be provided with high aspect ratio roughness. That is, projections may be provided to increase the roughness of the surface to increase the effective surface area. This may increase recombination of H*.

The arrangements of the contaminant seal 50 and the housing 56 described suppresses H* flux within the slit 62 of the contaminant seal 50 via recombination in a similar way as described above in relation to FIG. 3. This is advantageous because it can lead to a reduction in the diffusion of contaminants. This is because, due to flow arrangement, the H* generated in EUV plasma streams into the slit 62 of the contaminant seal 50 may promote particles 'hopping' between the two planes of a particle seal facing each other. Hopping of particles, in combination with the seal and long stroke scanning (in X), leads to the risk of the diffusion of contaminants to the reticle environment.

Although the above description has been concerned with a conductive coating being applied to a component (i.e. a component being treated to have a conductive component, it will be appreciated that the components may also be at least partially made from the materials of the conductive coating. This may be in addition to, or alternatively to having the conductive coating applied to their surfaces. In some embodiments, the components may be fully formed from a material which has been described above as being suitable for use as the conductive coating.

It will be appreciated that the advantages of the conductive coating may be readily realised by the components themselves being at least partially, or fully, formed of the materials described. More particularly, the components may be made from at least one of a noble metal, a noble metal alloy, preferably comprising Ru, Rh, Pd, Pt; or a metal, a metal alloy, or a conductive ceramic, based on metal nitride, boride, carbide, oxide or a mix of ceramics: for example CrN, TiN, ZrN, ZrB, TaB, TiO, $CrO_2$, $MnO_2$, $MoO_2$, $TcO_2$, $RuO_2$, $RhO_2$, $WO_2$, $ReO_2$, $IrO_2$, $MO_4O_{11}$, $ReO_3$.

A further embodiment to reduce defectivity in the patterning device environment will now be described. The composition of gas in the RME 22 may be decoupled from the composition of gas in the rest of the lithographic apparatus LA due to the design of the flow. Thus, it is possible to provide in the RME a low level of concentration of gases, which may not be allowed in the rest of the lithographic apparatus LA (for example, $O_2$).

A gas inlet (or gas jets) (not shown) may form part of the contaminant seal 50. The gas flow from the gas inlet may provide extra flow against the escaping contaminant particles. The gas flow is enriched in $O_2$ to convert H* to $H_2O$ instead of allowing H* to react with material of contaminants, such as slab-generated particles. More generally, the gas converts radicals to molecules. The required concentration of the gas is in the sub 100-1000 ppm levels.

In other words, the gas inlet is configured such that the gas enriched in oxygen flows at or near the contaminant seal 50 such that H* (or other radicals) react with the oxygen rather than with contaminants. More particularly, the gas may flow in the slit 62. The gas may flow from the RME 22 to or towards the relative vacuum or low-pressure environment 54 within the housing 56. It will be appreciated that in other embodiments, gases other than oxygen may be used, for example, $H_2O_2$, NO, $NO_2$.

In another embodiment, the existing gas flow in the patterning device environment or the RME 22 may be enriched in $O_2$ and/or $H_2O_2$. This may be in sub 100 to 1000 ppm levels. Alternatively, new gas inlets may be added to insert gas enriched in $O_2$ and/or $H_2O_2$. This may be by providing additional nozzles (gas inlets) near critically contaminated areas to promote conversion of H* to $H_2O$ instead of reacting with particles. In other words, one or more gas inlets are configured such that gas (e.g. enriched in oxygen) flows at or near a component of the patterning device environment 30 such that radicals react with the gas rather than with contaminants. These components may be the critically contaminated components described earlier.

More generally, the method comprises inserting (flowing) gas from the gas inlet into the patterning device environment 30 (and/or the RME 22), the gas being for converting radicals to molecules.

Additional binding of particles by indirectly supplied water may be provided by an additional van der Waals interaction or Hydrogen-bonds between particle, physiosorbed water molecules and the surface.

It will be appreciated that the use of the enriched gas described above may be alternatively or additionally to the component being treated to suppress EUV plasma-induced contaminant release and/or atomic hydrogen or other radicals induced defectivity (e.g. components having conductive or high recombination coatings or projections in the RME or patterning device environment).

Figure 5:
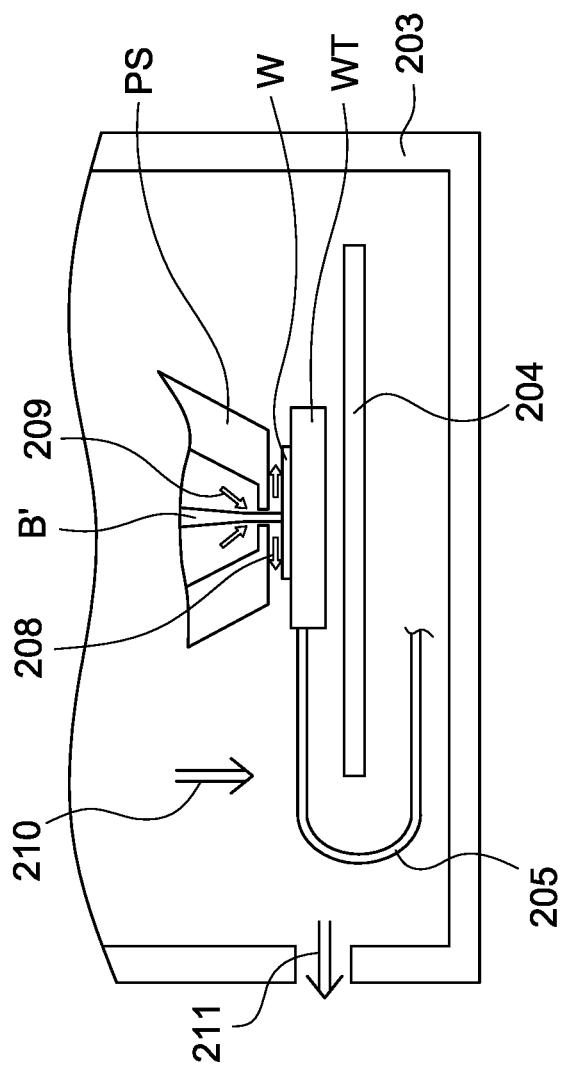
FIG. 5 depicts a portion of a lithographic apparatus comprising a conduit array.

FIG. 5 shows a portion of a lithographic apparatus, such as that shown in FIG. 1, arranged in a vessel 203 in which a relative vacuum or low-pressure environment is provided. Within the vessel 203, a substrate W is located on a substrate table WT and a projection system PS is arranged to project a patterned EUV radiation beam B' onto the substrate W. The substrate table WT is provided on a substrate table support 204 configured to move the substrate table WT relative to the projection system PS. To this end, the substrate table support 204 may be provided with actuators; motors, for example. A conduit array 205 is connected to the substrate table WT. The conduit array 205 comprises one or more conduits for providing at least one of electricity, data transfer, gas or liquid to or from the substrate table WT. For example, the conduit array 205 may comprise at least one wire or cable for sending electrical signals. Alternatively or in addition, the conduit array 205 may comprise at least one pipe or tube for conveying fluid. It will be appreciated that references herein to conduits in the plural may also refer to a single conduit, and vice versa. It will be appreciated that a conduit array as described herein may alternatively or additionally be provided for supplying the support structure MT and/or other components of the lithographic apparatus LA. For example, a conduit array as described herein may be used to supply the substrate table and/or the support structure and/or any other moving actuator within a lithographic tool or apparatus.

The conduit array 205 may comprise a plurality of conduits arranged side by side, that is, the conduits may be arranged such that any particular conduit has adjacent conduits in only one axis (e.g. horizontally or vertically). For example, the conduit array 205 may be, for example, a ribbon cable. Alternatively, the conduit array may be configured in a 'bundle'; in other words, the conduits may be arranged such that any particular conduit may have adjacent conduits in two axes (e.g. horizontally and vertically). As depicted in FIG. 5, the conduit array 205 may have a curved structure, e.g. with the array curving between terminals of the conduits. It may be desirable to provide a constant bending radius of the curved conduit array 205.

An amount of gas (e.g. hydrogen) may be provided to the projection system PS and/or to the vessel 203, for example via inlets 209 and 210. Gas exhausts 208 and 211 are also provided in the projection system PS and in the vessel 203, respectively. Contaminant particles, for example in the vicinity of the substrate W, may be carried away through the gas exhausts 208 and 211 by the flow of gas. The composition of gases provided at the inlet 209 in the projection system PS and at the inlet 210 in the vessel 203 may be different. For example, water vapor may be present to a greater or lesser extent in each case. In particular, the gas injected at inlet 210 in the vessel 203 may include 10 to 1000 times more water vapor than the gas injected at inlet 209 in the projection system PS. It may be desirable for the gas injected at inlet 209 to be substantially pure hydrogen, for example, to avoid EUV absorption and/or oxidization of optical components within the projection system PS.

The conduit array 205 accommodates the movement of the substrate table WT when the latter is moved relative to the projection system PS and is thus an actively moving part of the lithographic apparatus. The conduit array 205 may be prone to wear as a consequence of the movement. In particular, particles may be generated as a result of wear or fatigue of materials of the conduit array 205. These contaminant particles may be carried away from the vessel 203 via gas exhaust 210. However, some contaminant particles may remain in the vessel 203 and become incident upon the patterning device and/or damage other components of the lithographic apparatus, for example sensors or mirrors (in the case of particles from the conduit supplying the support table MT), or the particles may land on the substrate W.

Based on the analysis of typical Hamaker constants, for different material pairs and considering the role of capillary forces and hydrogen bonds, it has been found that contaminant particles may be inhibited from drifting around the vessel 203 by providing a suitable coating on at least one conduit of the conduit array. In particular, the coating is configured to promote adhesion of contaminants to the coating. The coating may be configured to retain a contaminant on the surface of the conduit. That is, even if particles are released or become detached from the surface of the conduit through material fatigue or wear, the coating is configured such that said particles adhere to or become trapped on the surface rather than becoming airborne and/or drifting away from the conduits. The coating may be configured to attract a contaminant to the surface of the conduit, for example by means of electrostatic field generated in the vicinity of the coating. The coating may be conductive. Alternatively the coating may be a hydrophilic coating. It will be appreciated that any suitable hydrophilic coating may be used. In some embodiments the coating may be both conductive and hydrophilic. For example, after the conductive coating has been applied to a conduit, the coating may be further treated (e.g. subjected to a plasma) in order to promote hydrophilicity of the coating material and/or of the conduit surface. The coating may be provided in multiple layers. In such cases, the outermost layer may be hydrophilic.

Figure 6:
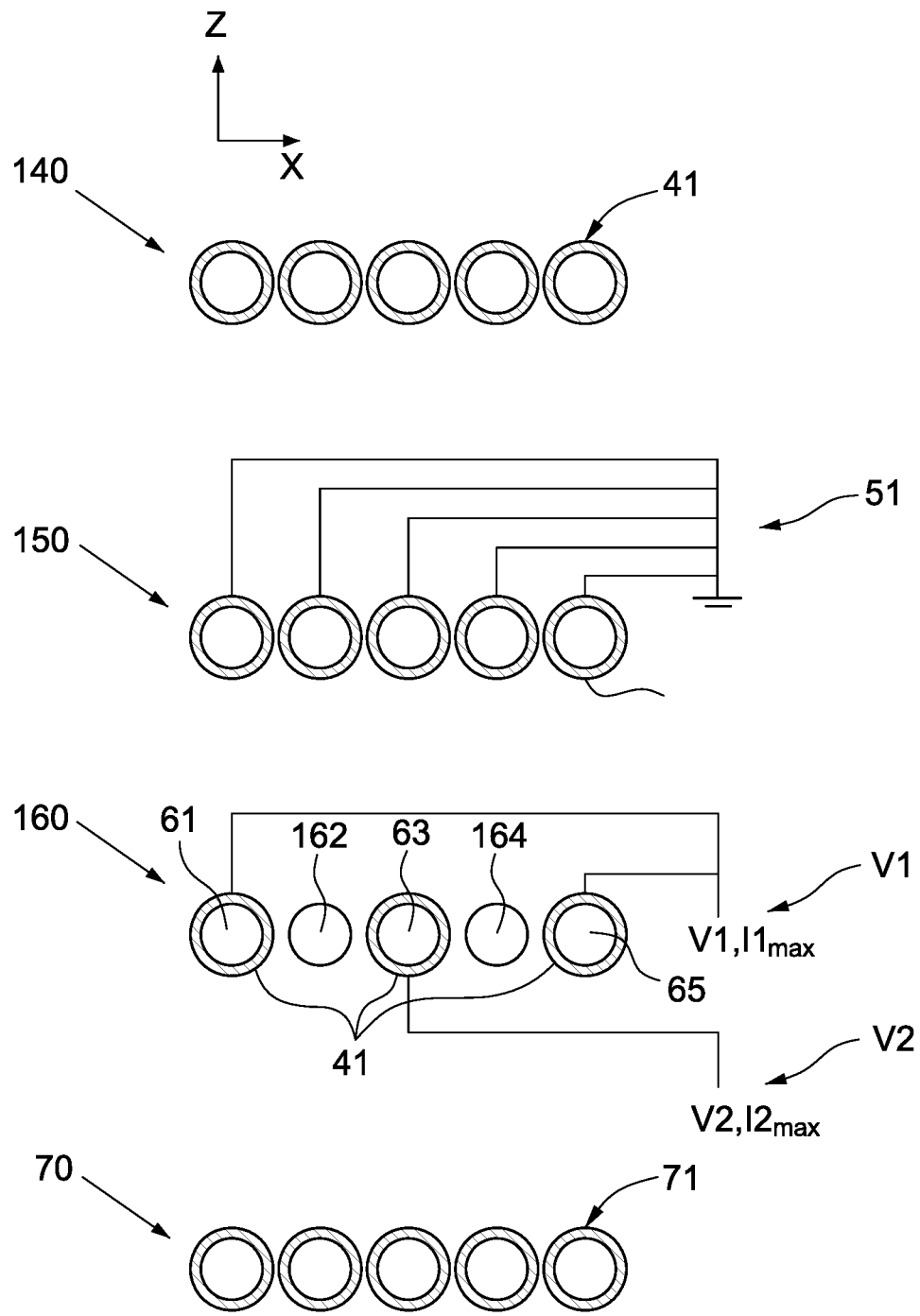
FIG. 6 depicts cross-sectional views of arrays of conduits having different configurations.

FIG. 6 shows cross-sectional views of four arrays of conduits 140, 150, 160, 70 having five conduits each. At least some of the conduits of each conduit array 140, 150, 160, 70 are provided with coatings 41, 71 configured to promote adhesion of a contaminant to the surface. Although each of the depicted arrays of conduits 140, 150, 160, 70 has five conduits, it will be appreciated that arrays of conduits may have more or fewer conduits, depending on application-specific requirements. In addition, although the depicted arrays of conduits 140, 150, 160, 70 are each configured in a row (i.e. all of the conduits within each array 140, 150, 160, 70 are arranged side by side), it will be appreciated that the conduits may be arranged in a different configuration in each conduit array. For example, the conduits within any of the arrays of conduits may be arranged in a bundle with some conduits on top of or below others. In FIG. 6, the conduits of each conduit array 140, 150, 160, 70 are spaced apart from one another; however, it will be appreciated that a conduit array may also be configured such that adjacent conduits touch one another. For example, the conduit array may comprise a ribbon cable. Alternatively or in addition, the conduit array may comprise one or more pipes or tubes configured to allow the passage of fluid.

The coating 41, 71 may have a thickness in the range from 1 nm to 10 μm, more preferably in the range from 10 nm to 1 μm. In particular, the thickness of the coating 41, 71 may be chosen to minimize the possibility of the coating peeling away from the conduit surface. The coating may have a substantially uniform thickness along the length of a conduit. Alternatively, the coating may have a thickness which varies along the length of the conduit. In particular, the coating may be corrugated to better accommodate repetitive bending load and improve fatigue resistance. The ratio of the thinnest part of the corrugated coating to the thickest part of the corrugated coating may be in the range from 0 to 0.5, preferably from 0.001 to 0.1.

The first conduit array 140 depicted in FIG. 6 is provided with a conductive coating 41. The conductive coating 41 may comprise a metal (such as a noble metal (Rh, Pd, Ru, Pt, Ag or Au and/or their alloys), Cr or Al), an alloy and/or a flexible conductive ceramic (for example a thin layer of nitride, boride, carbide or oxide). In particular, the coating 41 may comprise ITO, TiN or CrN. The coating 41 may comprise a carbon-based material, such as graphene or diamond-like carbon (DLC). Alternatively or in addition, the coating 41 may comprise a composite material. For example, the coating 41 may comprise microfibers, nanofibers, nanoparticles or carbon nanotubes. Carbon nanotubes included in the coating 41 may additionally be metallized and/or arranged in an ordered configuration within the coating 41 (for example perpendicular to the longitudinal axis of the conduit). The material or materials of the coating 41 may be chosen to be resistant to chemical embrittlement (for example oxidation or hydrogen embrittlement). This may minimize the likelihood of wear or fatigue of the coating 41. It may be desirable to avoid the use of pure metallic or alloyed Ta, Ti, Zn, Nb, Nd, Cu and/or Ni in the coating 41 in order to avoid hydrogen embrittlement.

The second conduit array 150 is also provided with the conductive coating 41, which in this case is provided with a ground connection 51. It will be appreciated that the second conduit array 150 may alternatively be provided with a conductive coating having a different composition to the conductive coating 41. In an alternative configuration, the conductive coating 41 may be provided with an electrical bias. For example, a voltage in the range from 10 to 100 V may be provided. It will be appreciated that the voltage level may be selected so as to minimize the possibility of electric arcs being generated. It may also be desirable to limit the current of the potential source, for example to approximately 10 mA, to prevent electrical discharge from converting to a high-current spark which may generate further contamination. The bias may be tuned to the primary charge of the contaminant particles. For example, the charge of a particle may depend on the manner in which the particle was generated (e.g. through movement of the conduit array, friction or wear, bending stress, interaction with plasma, etc.) and thus it may be possible to predict the primary charge of contaminant particles and tune the electric field provided by the bias accordingly. More specifically, it may be desirable to tune the electric field, provided by the bias and given the geometrical constraints of electrodes, such that particles are attracted to the conducting/biased surfaces instead of rejected therefrom or picked up and moved by external flows of gases. Adhesion of such particles to the surface(s) may also be improved in this way.

In another configuration, different bias voltages may be provided to the coatings on individual conduits of a conduit array 160. In order to avoid short circuits, the conductive coating 41 is provided only on alternate conduits of the array 160 with the remaining conduits provided, for example, with an insulating coating. In particular, in the event that a first conduit is provided with the conductive coating and biased at a first potential, and a second conduit of the array is provided with the conductive coating and biased at a second potential which is different from the first potential, at least one third conduit which is not provided with the conductive coating should separate the first conduit from the second conduit in order to avoid a short circuit. The third conduit array 160 illustrated in FIG. 6 is configured with two potentials, as described above. A first conduit 61 on the left of the array (as viewed on the page) is provided with the conductive coating 41 and biased at a first potential V1. A second conduit 63 is also provided with the conductive coating 41 and biased at a second potential V2. A third conduit 62 which separates the first conduit 61 from the second conduit 63 is not provided with the conductive coating (but may, for example, be provided with another coating such as an insulating coating and/or a hydrophilic coating). This pattern may be repeated across the width of the conduit array. For example, as shown in FIG. 6, the conduit array 60 also comprises a fourth conduit 65 with a conductive coating 41 biased at the first potential V1 and separated from the second conduit 63 by a fifth conduit 164 which is not provided with the conductive coating 41. In other words, the sequence of conduits from left to right is conductive coating biased at first potential, no conductive coating, conductive coating biased at second potential, no conductive coating, conductive coating biased at first potential.

In some configurations, the coating may be additionally or alternatively hydrophilic. The conduit array 70 illustrated in FIG. 6 is provided with a hydrophilic coating 71. Water vapor present in the atmosphere around the conduit array may be attracted to the hydrophilic coating. One will appreciate additional benefits of the hydrophilic coating or conduit surface treatments, such as improved cleanability by wet wipes and/or dissipation of potentials generated by motion/friction of conduits.

Figure 7A:
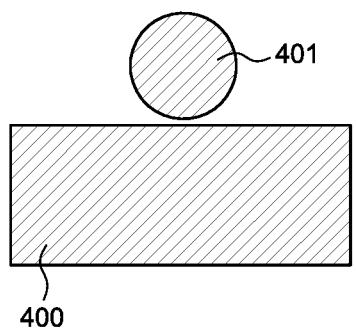
FIGS. 7A-7D show particles adhering to various configurations of surfaces with or without coatings.
Figure 7B:
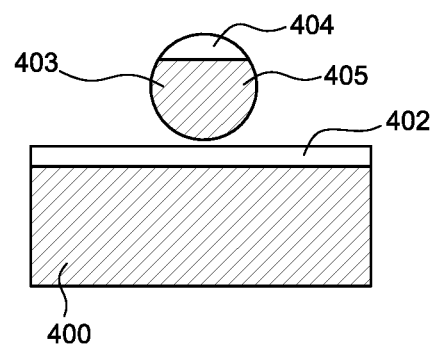
Figure 7C:
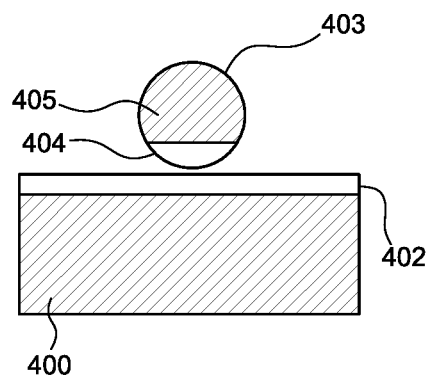

The coatings described above with respect to FIG. 6 promote adhesion of contaminant particles to the surface of the conduit(s). This adhesion prevents the particles from becoming airborne and/or drifting around the environment surrounding the conduit array. In a lithographic apparatus, this is particularly desirable since drifting particles may end up settling on and/or damaging sensitive components, such as optical components, of the apparatus. In some configurations, the coating(s) may be configured to retain a contaminant on the surface of the conduit or conduits provided with the coating. In some configurations, the coating may be configured to attract a contaminant to the surface of the conduit(s). FIGS. 7A-D show particles adhering to various configurations of surfaces with or without coatings. In FIG. 7A, a particle 401 and a surface 400 to which the particle 401 adheres are formed from a dielectric material. In FIGS. 7B and 7C, the surface 400 is provided with a conductive coating 402. The particle 403 is a particle of the surface which has become loose (for example, through wear or material fatigue). As a result, the particle 403 comprises a portion 404 made of the conductive coating material 402 as well as a portion 405 made of the dielectric surface material 400. In FIG. 7B, the dielectric material portion 405 of the particle 403 is in contact with the conductive coating 402 on the surface 400. In contrast, in FIG. 7C, it is the conductive coating material portion 404 of the particle 403 which is in contact with the conductive coating 402 on the surface 400.

It has been found that, by providing the conductive coating 402 on the surface 400, adhesion forces between the surface 400 and particles 403 which have become loose from the surface 400 may be increased by 3 times or more, for example, up to 10 times. In particular, the adhesion forces present in the configuration shown in FIG. 7B may be 3 times greater than the adhesion forces present in FIG. 7A. Likewise, the adhesion forces present in the configuration shown in FIG. 7C may be up to 10 times greater than those present in FIG. 7A.

Figure 7D:
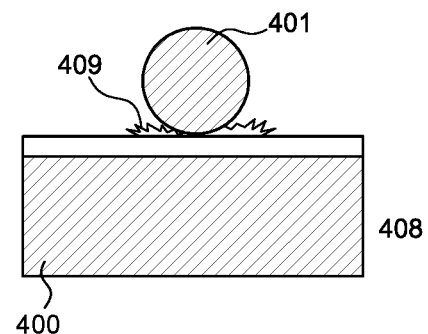

FIG. 7D shows a dielectric surface 400 provided with a hydrophilic coating 408. The hydrophilic coating 408 may comprise a hydrophilic material such as Aquacer, a polymerized HMDSO or other siloxanes. Alternatively, the hydrophilic coating 408 may comprise the conductive coating described with reference to FIGS. 7A to 7C which has been subjected to a process to render it hydrophilic. For example, the coating 408 may be exposed to a plasma or subject to some other hydrophilizing treatment known to the skilled person. A source of water vapor may be provided in the vicinity of the conduit array. In a lithographic apparatus, water vapor may be present in a low-pressure environment surrounding the conduit array. The water vapor pressure may, for example, exceed 1×10-7 mbar, and may preferably exceed 1×10-3 mbar. At least a portion of the water vapor present in the local atmosphere will condense as surface water 409 on the conduit. A dielectric particle 401 adheres to the surface water 409 with an adhesion force which may be, for example, 10 to 100 times greater than the adhesion force present where no coating is provided, as in FIG. 7A.

A hydrophilic coating 408 may also improve cleanability of the conduit surfaces. In particular, removal of particles from the coated surface (e.g. with a moistened cloth or wet wipe, or using a sonic bath wet cleaning method) may be made easier by the hydrophilic coating 408.

The electrically conductive and/or hydrophilic coating may be provided only on certain sections of the conduit or conduits. For example, the coating may be interrupted where it is likely that the conduit(s) will come into contact with other portions of the apparatus or other conduits in order to avoid the coating being rubbed or scraped off during contact. In this way, generation of additional contaminating particles owing to wear of the coating may be minimized.

Figure 8:
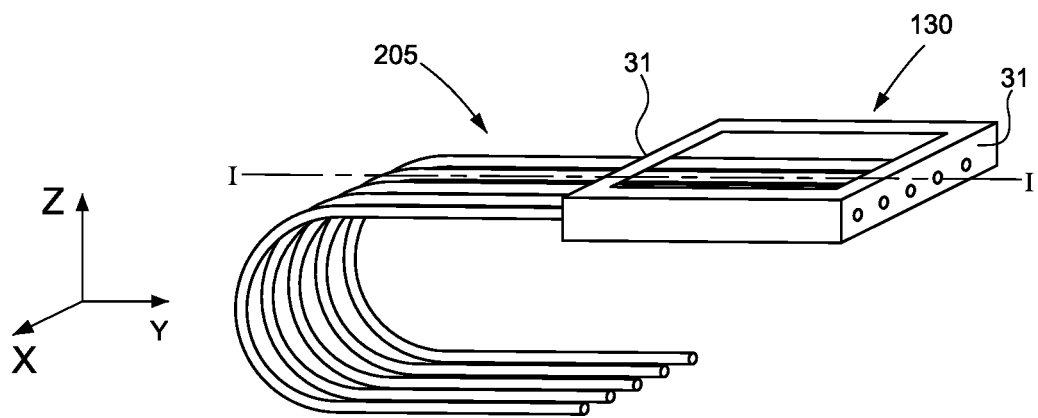
FIG. 8 depicts a further conduit array.
Figure 9:
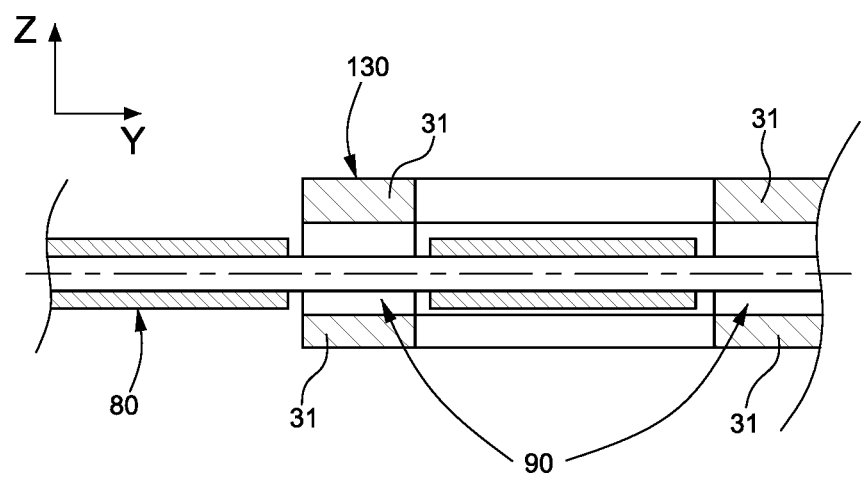
FIG. 9 depicts a section along the line I-I shown in FIG. 5.

The conduit array 205 may pass through a guide 130, as illustrated in FIGS. 8 and 9. The conduits may come into contact with a portion of the guide 130, for example an edge portion 31 of the guide 130. The conduit array 205 is provided with a conductive and/or hydrophilic coating 80. It may be desirable to interrupt the coating 80 at the portion of the conduit(s) which may come into contact with the guide 130 in order to avoid the coating 80 being damaged by said contact and generating particles which may be released into the atmosphere around the conduit array 205. FIG. 9 shows a section along the line I-I illustrated in FIG. 8 (i.e. along the length of a conduit). The conduits pass through a guide 130 having a hollow rectangular form. It will be appreciated, however, that the guide may take any suitable form. The conduit(s) may come into contact with an edge portion 31 of the guide where the conduit(s) emerge on either side of the guide 130. In order to minimize damage to the conduit(s) and/or the coating 80 thereon, no coating is provided on the portion of the conduit in the region of the edge portion 31 of the guide 130. In this way, a gap 90 is created between the conduit(s) and the guide 130 which reduces the likelihood of the conduit(s) and the guide 130 coming into contact with one another.

At least a portion of the guide 130 may additionally be provided with a coating configured to reduce friction and/or wear on the conduits. For example, the guide 130 (in particular an edge portion 31 of the guide 130) may be provided with a non-stick and/or anti-friction coating. Additionally or alternatively, the guide 130 may be polished (e.g. electro-polished) to reduce surface roughness and hence reduce the likelihood of causing wear or damage to the conduit surface and/or coating. In this way, generation of particles may be minimized. Alternatively or additionally, a second, coating may be provided on the conduit in the region that is expected to be subject to wear or friction. The second coating may have different composition from the first coating. For example, the second coating may be more robust against wear, that is the coating may be selected to minimize particle generation. Alternatively or in addition, a coating or surface finish may be provided on the guide to minimize particle generation caused by friction between the guide and the conduit array.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Described herein is a conduit array comprising at least one conduit. The at least one conduit may, for example, be for providing at least one of electricity, data transfer, gas or liquid. A surface of at least one conduit of the array is treated, the treatment promoting adhesion of a contaminant to the at least one conduit. For example, a coating may be provided on at least one conduit of the array, the coating being configured to promote adhesion of a contaminant to the coating.

By promoting the adhesion of a contaminant to the conduit (for example, to a coating on the conduit), it is possible to reduce the likelihood of contaminant particles drifting away and becoming incident on other surfaces where they may cause damage. It will be appreciated that such particles may originate from the coating and/or the conduit array, or from another source. In particular, particles may be generated through material fatigue or wear of a surface of the conduit array and/or of the coating.

The coating may be configured to retain a contaminant on the surface of the conduit. In other words, even if particles are released or become detached from the surface of the conduit through material fatigue or wear, the coating is configured such that said particles adhere to or become trapped on the surface rather than becoming airborne and/or drifting away from the conduit. In this way, such particles are prevented from causing damage by becoming incident on other surfaces.

The coating may be configured to attract a contaminant to the surface of the conduit. Contaminant particles which are attracted to the surface of the conduit may be retained thereon and thus prevented from becoming incident on other surfaces, which may be more sensitive to the presence of such particles. The attractive force may be, for example, an electrostatic force. The attraction may be provided by an electrostatic field generated in the vicinity of the coating.

The coating may be conductive. The conduit array may comprise a first conduit provided with the coating, wherein a first bias voltage is applied to the coating of the first conduit. The conduit array may further comprise a second conduit provided with the coating and a third conduit that is substantially dielectric, wherein a second bias voltage, which is different from the first bias voltage, is applied to the coating of the second conduit and wherein the first conduit and the second conduit are separated from one another by the third conduit. It will be appreciated that the first and second conduits may alternatively be separated from one another by another part of the conduit array that is substantially dielectric. In this way, a short circuit condition between the first and second conduits is avoided. Providing one or more bias voltages may further promote adhesion of contaminant particles to the surface of the conduit(s). In particular, the bias voltage may cause particles to be attracted to the surface.

The coating may be provided with a ground connection. The ground connection may cause dissipation of charges and potentials; such charges/potentials may be associated with bending or friction of at least some of the conduits. In particular, it may be desirable to dissipate such charges or potentials to avoid any inadvertent effect of boosting the release or generation of particles of material from the conduits or corresponding parts within the lithographic apparatus. Additionally, the ground connection may provide continuous removal of the particles, carrying predominantly one sign charge (otherwise the conduit charge may saturate and the conduit may begin to reject particles). The bias source may be current-limited, for example to less than 10 mA, in order to minimize damage in the event of a short-circuit occurring.

The coating may comprise a composite material. In particular, the coating may comprise microfibers, nanofibers, nanoparticles or carbon nanotubes. A composite material may be particularly resistant to wear, thus minimizing the amount of particles generated through material fatigue or wear of the coating. Where carbon nanotubes are used, these may be metallized or non-metallized. Metallization of CNT (carbon nanotubes) may boost their wettability and improve either their deposition or the resulting hydrophilicity of the coating, which is in itself beneficial The coating may comprise a noble metal, preferably Rh, Pd, Ru, Ag, Au or Pt, or an alloy that comprises at least one of the listed metals; or the coating may comprise one or more metals such as Cr or Al. The coating may comprise an alloy comprising at least 10% of any of Rh, Pd, Ru, Ag, Au, Pt, Cr or Al. The use of any of the listed metals in the coating composition may make the coating particularly resistant to chemical embrittlement, for example oxidation or hydrogen embrittlement. The coating may comprise an alloy comprising Pt and Au in a ratio of 9:1. This combination may be particularly resistant to wear.

Other aspects of the invention are set out as in the following numbered clauses:

1. A conduit array comprising at least one conduit, wherein the at least one conduit has been treated to promote adhesion of a contaminant to the at least one conduit.
2. The conduit array of clause 1, wherein the at least one conduit has been treated to provide a coating configured to promote adhesion of a contaminant to the conduit.
3. The conduit array of clause 2, wherein the coating is configured to retain a contaminant on the surface of the conduit.
4. The conduit array of clause 2 or 3, wherein the coating is configured to attract a contaminant to the surface of the conduit.
5. The conduit array of any of clauses 2 to 4, wherein the coating is conductive.
6. The conduit array of clause 5, wherein the conduit array comprises a first conduit provided with the coating, and wherein a first bias voltage is applied to the coating of the first conduit.
7. The conduit array of clause 6, wherein the conduit array further comprises a second conduit provided with the coating and a third conduit that is substantially dielectric, and wherein a second bias voltage, which is different from the first bias voltage, is applied to the coating of the second conduit, wherein the first conduit and the second conduit are separated from one another by the third conduit.
8. The conduit array of clause 5, wherein the coating is provided with a ground connection.
9. The conduit array of any of clauses 2 to 8, wherein the coating comprises a composite material.
10. The conduit array of clause 9, wherein the coating comprises microfibers, nanofibers, nanoparticles or carbon nanotubes.
11. The conduit array of any of clauses 2 to 10, wherein the coating comprises a noble metal, such as Rh, Pd, Ru, Pt, Ag Au or their alloys and/or Cr or Al.
12. The conduit array of any of clauses 2 to 11, wherein the coating comprises a flexible conductive ceramic.
13. The conduit array of clause 12, wherein the coating comprises ITO, TiN or CrN.
14. The conduit array of any of clauses 2 to 13, wherein the coating comprises a carbon-based material.
15. The conduit array of clause 14, wherein the coating comprises graphene or DLC.
16. The conduit array of any of clauses 2 to 15, wherein the coating has a thickness of between 1 nm and 10 µm.
17. The conduit array of clause 16, wherein the coating has a thickness of between 10 nm and 1 µm.
18. The conduit array of any of clauses 2 to 17, wherein the thickness of the coating varies along the length of the conduit.
19. The conduit array of clause 18, wherein the coating is corrugated.
20. The conduit array of clause 19, wherein the ratio of the thinnest part of the corrugated coating to the thickest part of the corrugated coating may be in the range from 0 to 0.5, preferably from 0.001 to 0.1.
21. The conduit array of any of clauses 2 to 20, wherein the coating is provided only on certain sections of the conduit.
22. The conduit array of any of clauses 2 to 21, wherein the coating comprises a plurality of layers.
23. The conduit array of clause 22, wherein the outermost layer is hydrophilic.
24. The conduit array of any of clauses 2 to 21, wherein the coating is hydrophilic.
25 The conduit array of clause 1, wherein the at least one conduit is treated to become hydrophilic.
26. The conduit array of clause 25, wherein the at least one conduit is treated using plasma oxidation.
27. The conduit array of any preceding clause, wherein the conduit array is a ribbon cable.
28. A lithographic apparatus comprising a conduit array of any preceding clause.
29. A lithographic tool comprising a conduit array of any preceding clause.

The invention claimed is:

1. A component disposed in a patterning device environment including a patterning device,
   wherein the component is treated to suppress EUV plasma-induced contaminant release or atomic hydrogen or other radicals induced defectivity,
   wherein the patterning device environment receives a radiation beam from an illumination system of a lithographic apparatus and transmits a patterned radiation beam to a projection system of the lithographic apparatus,
   wherein the component is disposed in a reticle mini environment within the patterning device environment, and
   wherein the component is a patterning device support, a clamp, a fiducial, an encoder, a patterning device masking apparatus, a patterning device masking apparatus motion/control module, a radiation beam uniformity adjustment apparatus, a patterning device exchange apparatus, a patterning device actuator, a gas exhaust system, a contaminant seal configured to isolate a volume for the patterning device from a relative vacuum or low-pressure environment, or a housing of the relative vacuum or low-pressure environment.

2. The component of claim 1, wherein the component comprises a coating, the coating comprising a conductive coating and/or a recombination coating having a recombination coefficient of at least 0.1.

3. The component of claim 2, wherein the conductive coating comprises a metal, metal alloy, noble metal, noble metal alloy, Ru, Rh, Pd, Pt, a conductive ceramic based on metal nitride, boride, carbide, oxide, or a mix of ceramics, CrN, TiN, ZrN, ZrB, TaB, TiO, $CrO_2$, $MnO_2$, $MoO_2$, $TcO_2$, $RuO_2$, $RhO_2$, $WO_2$, $ReO_2$, $IrO_2$, $Mo_4O_{11}$, or $ReO_3$.

4. The component of claim 2, wherein the recombination coating has a recombination coefficient of at least 0.1 for atomic hydrogen.

5. The component of claim 4, wherein the coating comprises a recombination coefficient of at least 0.1 for atomic hydrogen and comprises a noble metal or a noble metal alloy.

6. The component of claim 2, wherein the component is metallic or has an additional conductive coating upon which the coating is located.

7. The component of claim 1, wherein the component comprises a dielectric.

8. The component of claim 7, wherein the component comprises an inter-diffusion layer between a conductive coating and the dielectric.

9. The component of claim 1, wherein a surface of the component has been treated to provide projections to increase the effective surface area.

10. The component of claim 9, wherein the pitch (γ) of the projections to the amplitude (A) of the projections is γ/A<0.3.

11. A lithographic apparatus comprising:
- an illumination system configured to provide a radiation beam;
- a projection system configured to receive a patterned radiation beam and project the patterned radiation beam onto a substrate;
- a patterning device environment configured to receive the radiation beam and transmit the patterned radiation beam;
- a patterning device disposed in the patterning device environment and configured to interact with the radiation beam and generate the patterned radiation beam; and
- a component disposed in a reticle mini environment within the patterning device environment,
- wherein the component is treated to suppress EUV plasma-induced contaminant release or atomic hydrogen or other radicals induced defectivity, and
- wherein the component is a patterning device support, a clamp, a fiducial, an encoder, a patterning device masking apparatus, a patterning device masking apparatus motion/control module, a radiation beam uniformity adjustment apparatus, a patterning device exchange apparatus, a patterning device actuator, a gas exhaust system, a contaminant seal configured to isolate a volume for the patterning device from a relative vacuum or low-pressure environment, or a housing of the relative vacuum or low-pressure environment.

12. The lithographic apparatus of claim 11, further comprising an electrical connector configured to add a voltage bias to a conductive coating provided on at least one dielectric surface of the component.

13. The lithographic apparatus of claim 12, wherein the voltage bias is limited to no more than 10 V and the current is limited to no more than 100 mA.

* * * * *